US008795856B2

(12) United States Patent
Kaiju et al.

(10) Patent No.: US 8,795,856 B2
(45) Date of Patent: Aug. 5, 2014

(54) NICKEL THIN FILM, METHOD FOR FORMATION OF THE NICKEL THIN FILM, FERROMAGNETIC NANO-JUNCTION ELEMENT, METHOD FOR PRODUCING THE FERROMAGNETIC NANO-JUNCTION ELEMENT, THIN METALLIC WIRE, AND METHOD FOR FORMATION OF THE THIN METALLIC WIRE

(75) Inventors: Hideo Kaiju, Sapporo (JP); Manabu Ishimaru, Toyonaka (JP); Yoshihiko Hirotsu, Ibaraki (JP); Akito Ono, Sapporo (JP); Akira Ishibashi, Sapporo (JP)

(73) Assignees: National University Corporation, Sapporo-Shi, Hokkaido (JP); Hokkaido University, Sapporo-Shi, Hokkaido (JP)

( * ) Notice: Subject to any disclaimer, the term of this patent is extended or adjusted under 35 U.S.C. 154(b) by 561 days.

(21) Appl. No.: 12/679,293

(22) PCT Filed: Aug. 28, 2008

(86) PCT No.: PCT/JP2008/065924
§ 371 (c)(1),
(2), (4) Date: Jun. 17, 2010

(87) PCT Pub. No.: WO2009/041239
PCT Pub. Date: Apr. 2, 2009

(65) Prior Publication Data
US 2010/0266868 A1 Oct. 21, 2010

(30) Foreign Application Priority Data

Sep. 26, 2007 (JP) ................. 2007-248809
Mar. 17, 2008 (JP) ................. 2008-066929

(51) Int. Cl.
B32B 15/08 (2006.01)
C23C 16/00 (2006.01)
C23C 14/20 (2006.01)
H01L 43/12 (2006.01)
H01L 43/08 (2006.01)
C23C 14/26 (2006.01)
H01F 41/20 (2006.01)
H01F 10/14 (2006.01)

(52) U.S. Cl.
CPC ................ *C23C 14/20* (2013.01); *H01L 43/12* (2013.01); *H01L 43/08* (2013.01); *C23C 14/26* (2013.01); *H01F 41/20* (2013.01); *H01F 10/14* (2013.01)
USPC ..... 428/811.1; 428/212; 428/461; 428/692.1; 427/123

(58) Field of Classification Search
USPC ......................................... 428/457
See application file for complete search history.

(56) References Cited

U.S. PATENT DOCUMENTS 5,164,259 A * 11/1992 Ishida et al. .................. 428/323
(Continued)

FOREIGN PATENT DOCUMENTS

JP 2002-307607 10/2002
JP 2004-299187 10/2004

OTHER PUBLICATIONS

Machine Translation of Yanai et al., JP 2002-307607, Oct. 2003.*
(Continued)

*Primary Examiner* — Kevin Bernatz
(74) *Attorney, Agent, or Firm* — Christopher J. Knors; Moore & Van Allen PLLC

(57) ABSTRACT

A nickel thin film is formed, for example, to a thickness of 2 nm or more on a polyethylene naphthalate substrate by a vacuum evaporation method. A magnetoresistance effect element using ferromagnetic nano-junction is comprised by using two laminates each comprising a nickel thin film formed on a polyethylene naphthalate substrate, and joining these two laminates so that the nickel thin films cross to each other in such a manner that edges of the nickel thin films face each other.

4 Claims, 12 Drawing Sheets

(56) References Cited

U.S. PATENT DOCUMENTS

| | | | |
|---|---|---|---|
| 6,927,073 B2* | 8/2005 | Huggins | 438/3 |
| 2005/0141147 A1* | 6/2005 | Sbiaa et al. | 360/324.2 |
| 2007/0097555 A1* | 5/2007 | Garcia | 360/313 |
| 2010/0142259 A1* | 6/2010 | Drndic et al. | 365/158 |

OTHER PUBLICATIONS

National University Corporation Hokkaido University el al., Translation of the International Preliminary Report on Patentability, dated Apr. 15, 2010.

National University Corporation Hokkaido University el al., Translation of the Written Opinion of the International Searching Authority, dated Apr. 15, 2010.

Garcia, N. et al., "Magnetoresistance in excess of 200% in ballistic Ni nanocontacts at room temperature and 100 Oe", Phys. Rev. Lett., Apr. 5, 1999, vol. 82, No. 14, pp. 2923-2926 ISSN: 0031-9007.

Chopra, H.D. and Hua, S.Z., "Ballistic magnetoresistance over 3000% in Ni nanocontacts at room temperature", Phys. Rev. B, Jun. 26, 2002, vol. 66, No. 2, pp. 020403-1-020403-3 ISSN: 1098-0121.

International Searching Authority, PCT International Search Report Mailed on Dec. 9, 2008 for International Application No. PCT/JP2008/065924.

* cited by examiner

PEN
$R_a$ = 1.3 nm

Ni (6.3 nm) / PEN
$R_a$ = 1.1 nm

Ni (29 nm) / PEN
$R_a$ = 0.83 nm

Ni (41 nm) / PEN
$R_a$ = 0.69 nm

ADHESIVE
Ni
PEN

ADHESIVE
Ni
PEN

STATE A "0" ⇔ STATE B "1"

NICKEL THIN FILM, METHOD FOR FORMATION OF THE NICKEL THIN FILM, FERROMAGNETIC NANO-JUNCTION ELEMENT, METHOD FOR PRODUCING THE FERROMAGNETIC NANO-JUNCTION ELEMENT, THIN METALLIC WIRE, AND METHOD FOR FORMATION OF THE THIN METALLIC WIRE

CROSS-REFERENCE TO RELATED APPLICATIONS

This application is filed under the provisions of 35 U.S.C. §371 and claims the priority of International Patent Application PCT/JP2008/065924 filed on Aug. 28, 2008, which claims priority from Japanese Patent Application No. 248809/2007 filed on Sep. 26, 2007, and Japanese Patent Application No. 066929/2008 filed on Mar. 17, 2008, all three of which are incorporated by reference herein in their entirety.

TECHNICAL FIELD

The present invention generally relates to a nickel thin film, a method for formation of the nickel thin film, a ferromagnetic nano-junction element, a method for producing the ferromagnetic nano-junction element, a thin metallic wire, and a method for formation of the thin metallic wire, which is suitable to apply to a magnetoresistance effect element using ferromagnetic nano-junction, for example.

BACKGROUND ART

Conventionally, as methods for formation of an atomic-scale flat surface on a surface of a metallic substrate, there has been proposed a method executing the plural number of times repeatedly a step of placing a metallic substrate in ionic solution, and sweeping the potential of the metallic substrate the predetermined number of times repeatedly at a constant potential sweeping speed between a potential equal to or above oxidation potential and a potential equal to or below reduction potential, and a step of processing the metallic substrate the plural number of times repeatedly for the predetermined times at a potential equal to or below the above-mentioned oxidation potential and close to the oxidation potential (see Japanese Laid-open Patent Publication No. 144500/2000).

On the other hand, a substrate made of organic material is lightweight and has the flexibility. To make use of its features, the importance of a technology for forming a metal thin film on the substrate is growing. In this case, according to the usage of the metal thin film, it may be desired to form a metal thin film having an atomic scale flat surface on the substrate made of organic material. However, it is very difficult to completely remove roughness on a surface of a substrate made of organic material. Therefore, it is difficult to form a metal thin film having an atomic scale flat surface on a substrate made of organic material so far.

Therefore, a subject to be solved by the present invention is to provide a method for formation of a nickel thin film which enables to form very easily a nickel thin film having an atomic scale flat surface on a substrate made of organic material, and the nickel thin film formed by this method.

Another subject to be solved by the present invention is to provide a ferromagnetic nano-junction element which enables to realize very easily a ferromagnetic nano-junction element showing a giant magnetoresistance effect at room temperature, and a method for producing the ferromagnetic nano-junction element.

A further subject to be solved by the present invention is to provide a method for formation of a thin metallic wire which enables to form easily an ultra-fine thin metallic wire with nanometer-order line width, and the thin metallic wire formed by this method.

The above-mentioned and other subjects will be apparent from the description referring to the attached drawings.

DISCLOSURE OF INVENTION

The inventors of the present invention coincidentally use a polyethylene naphthalate substrate, a kind of substrate made of organic material, as a substrate for forming a metal thin film in the process to devote to solve the above-mentioned subjects existing in conventional techniques, and find out a peculiar phenomenon that in case of forming a gold thin film on the polyethylene naphthalate substrate, with the increase of the thickness, the surface roughness of the gold thin film increases abruptly in comparison with the surface roughness of the polyethylene naphthalate substrate, and for this, in case of forming a nickel thin film, on the contrary, with the increase of the thickness, the surface roughness of the nickel thin film decreases than the surface roughness of the polyethylene naphthalate substrate, thereby making it possible to flatten the surface in atomic scale. As a result, the inventors thought out the present invention.

That is, to solve the aforementioned subject, according to the first aspect of the invention, there is provided a method for formation of a nickel thin film characterized by forming a nickel thin film on a polyethylene naphthalate substrate.

According to the second aspect of the invention, there is provided a nickel thin film characterized by being formed on a polyethylene naphthalate substrate.

In the first and second aspects of the invention, a nickel thin film is formed preferably by a vacuum evaporation method, but other film formation method, for example, a sputtering method may be used. The surface roughness of the polyethylene naphthalate substrate is, for example, 1.6 nm or less, or 1.3±0.3 nm, but not limited to these figures. The configuration of the polyethylene naphthalate substrate is not limited, and may be a film-like substrate, a sheet-like substrate, or a bulk substrate. The thickness of a nickel thin film to be formed is appropriately decided according to the required surface roughness and its usage. For example, forming a film 2 nm or more thick, the surface roughness of the nickel thin film can be made smaller than the surface roughness of the polyethylene naphthalate substrate, and moreover, by increasing the thickness of the nickel thin film, the surface roughness can be decreased further, and by forming a film with a thickness of over 11 nm, a one atomic layer level surface roughness, that is, an atomic-scale flat surface can be obtained. Moreover, by controlling the thickness of the nickel thin film, the average grain size of the nickel thin film can be controlled as well as the surface roughness of the nickel thin film. The temperature to form a film is not limited as far as the temperature is lower than the glass transition temperature of the polyethylene naphthalate substrate. By making the temperature to form a film room temperature, heating of the substrate becomes unnecessary. As a result, electric power to form a film can be reduced. Also, the speed of forming a nickel thin film is not limited and is appropriately selected. For example, the speed is selected from about 0.5 to 1.5 nm per minute.

According to the third aspect of the invention, there is provided a method for producing a ferromagnetic nano-junction element, characterized by using two laminates each comprising a nickel thin film formed on a polyethylene naphthalate substrate, and joining these two laminates so that the nickel thin films cross to each other in such a manner that edges of the nickel thin films face each other.

According to the fourth aspect of the invention, there is provided a ferromagnetic nano-junction element characterized by using two laminates each comprising a nickel thin film formed on a polyethylene naphthalate substrate, and joining these two laminates so that the nickel thin films cross to each other in such a manner that edges of the nickel thin films face each other.

In the third and fourth aspects of the invention, the thickness of a nickel thin film of a laminate is selected in nanometer order. However, in order to obtain a giant magnetoresistance effect at room temperature, the thickness of the nickel thin film is preferably selected, for example, 10 nm or less. Especially, the thickness of the nickel thin film is preferably selected from 1 to 5 nm so that electrons are conducted ballistically without scattering at the junction between two edges of the nickel thin films of the two laminates, and ballistic magnetoresistance effect occurs.

Other than those above in the third and fourth aspects of the invention, the descriptions relating to the first and second aspects of the invention are applied.

According to the fifth aspect of the invention, there is provided a method for formation of a thin metallic wire characterized by forming a nickel thin film on a polyethylene naphthalate substrate.

According to the sixth aspect of the invention, there is provided a thin metallic wire characterized by comprising a nickel thin film formed on a polyethylene naphthalate substrate.

In the fifth and sixth aspects of the invention, the descriptions relating to the first and second aspects of the invention are applied.

According to the invention, it is possible to make the surface roughness of a nickel thin film smaller than the surface roughness of a polyethylene naphthalate substrate by forming the nickel thin film on the polyethylene naphthalate substrate, and by this, a nickel thin film with a surface roughness of 1 nm or less can be obtained. Further, a nickel thin film with a very small surface roughness of one atomic layer or less, that is to say, a nickel thin film with an atomic-scale flat surface can be obtained. And two laminates having a nanometer-order thick nickel thin film with an atomic-scale flat surface are joined so that the nickel thin films cross to each other in such a mariner that edges of the nickel thin films face each other. By this, a ferromagnetic nano-junction element showing a giant magnetoresistance effect at room temperature can be realized very easily. Also, by the nickel thin film formed on the polyethylene naphthalate substrate, a thin metallic wire with nanometer order ultra-fine line width can be obtained easily.

BEST MODE FOR CARRYING OUT THE INVENTION

Figure 1:
FIG. 1 is a cross-sectional diagram showing a method for formation of a nickel thin film according to the first embodiment of the present invention.

The present invention will be explained in detail below concerning the embodiments thereof with reference to the accompanying drawings. In all drawings of the embodiments, the same reference numerals are given to the same or corresponding parts.

First, a method for formation of a nickel thin film according to the first embodiment of the present invention is explained.

As shown in FIG. 1, in a method for formation of a nickel thin film, a nickel thin film 12 is formed on a polyethylene naphthalate substrate 11. The configuration of the polyethylene naphthalate substrate 11 is not limited, and it may be a film-like substrate, a sheet-like substrate or a bulk substrate. The vacuum evaporation method, etc. is used to form the nickel thin film 12. The temperature to form the film is, for example, room temperature.

An example is explained.

As the polyethylene naphthalate substrate 11, a PEN film (trade name: TEONEX Q65) having 5 mm width and 100 μm thickness supplied by Teijin DuPont Japan Ltd. is cut down to 2 mm width by using a slitter with the film-rolling-up system in clean environment. On the PEN film having 2 mm width and 100 μm thickness prepared by the above process, a nickel thin film 12 is formed by a vacuum evaporation method. The glass-transition temperature $T_g$ of the PEN film is 120° C.

Figure 2:
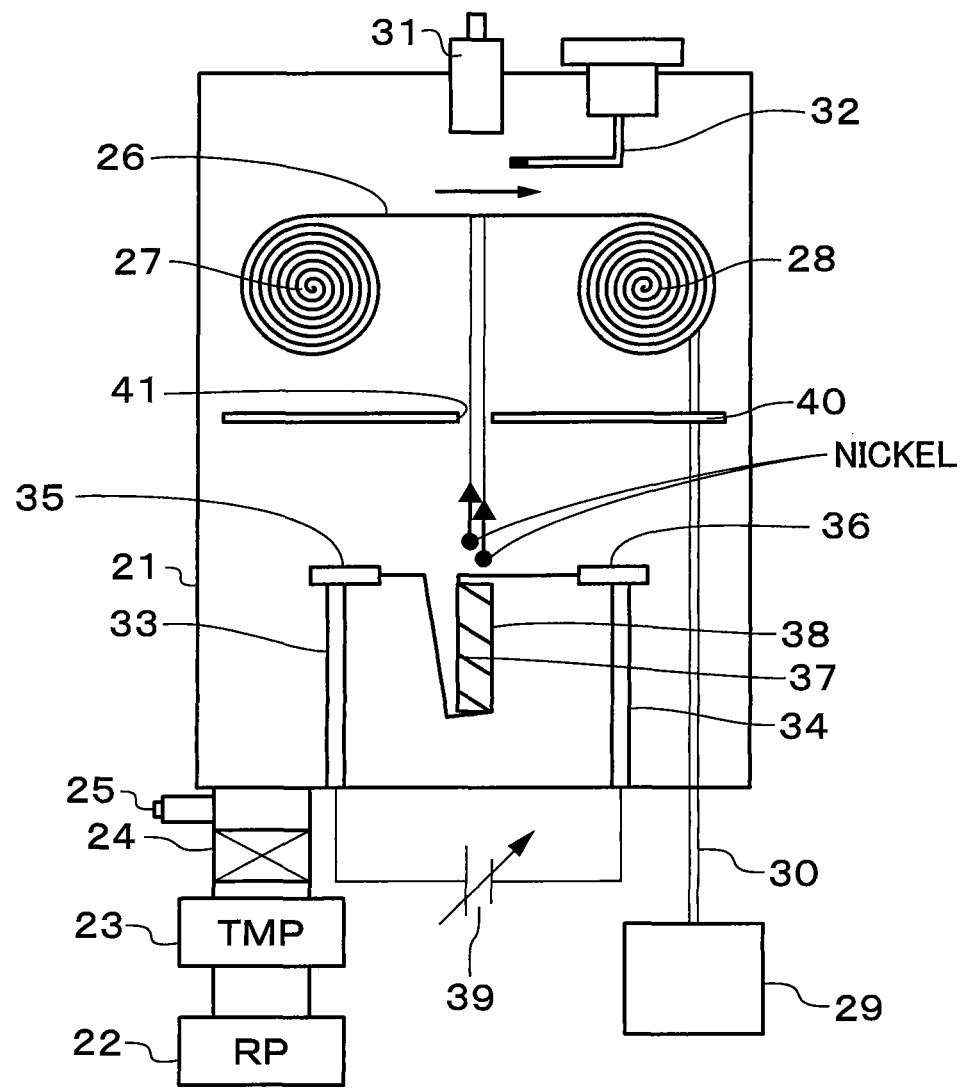
FIG. 2 is a schematic view of the vacuum evaporator used for forming a nickel thin film according to the first embodiment of the present invention.

FIG. 2 shows a resistance heating vacuum evaporator used to form a nickel thin film 12. As shown in FIG. 2, in the vacuum evaporator, a rotary pump (RP) 22 and a turbo-molecular pump (TMP) 23 are connected to the lower portion of a vacuum chamber 21, and by these rotary pump 22 and turbo-molecular pump 23, the inside of the vacuum chamber 21 can be, evacuated to the base pressure of ~$10^{-8}$ Torr. A gate valve 24 is equipped between the turbo-molecular pump 23 and the vacuum chamber 21. A cold cathode gauge 25 for pressure measurement is equipped at upstream side of the gate valve 24.

At the upper portion of the inside of the vacuum chamber 21, a roll 27 around which the PEN film 26 is rolled and a roll 28 for taking up the PEN film 26 are provided, fixed to the inner wall of the vacuum chamber 21 by supporting elements not shown. The take-up roll 28 can be rotated at the predetermined rotation speed by a rotation mechanism 30 controlled by a motor controller 29 provided outside of the vacuum chamber 21. At the upper portion of the vacuum chamber 21, an ion gauge 31 for pressure measurement and a thermocouple 32 for temperature measurement of the PEN film 26 are provided.

A pair of terminals for current injections 33 and 34 is equipped at the lower portion of the inside of the vacuum chamber 21. At the tips of these terminals for current injections 33 and 34, stainless steel pads 35 and 36 are equipped respectively, and a tungsten filament 37 is equipped between these pads 35 and 36. The central part of the tungsten filament 37 is winded spirally and a crucible 38 made of boron nitride is equipped in this part. The diameter of the tungsten filament 37 is 7 mm, for example. Nickel which becomes an evaporation source is loaded inside of the crucible 38. At the outside of the vacuum chamber 21, a power source 39 is connected between the terminals for current injections 33 and 34. By the power source 39, current flows in a circuit composed of the terminals for current injections 33 and 34, pads 35 and 36, and the tungsten filament 37, and the spiral part of the tungsten filament 37 is heated, and the crucible 38 can be heated.

Between the upper and lower positions of the inside of the vacuum chamber 21, a heat-block plate 40 is provided. The heat-block plate 40 has a hole 41 at upper part of the crucible 38. Nickel beams coming from the crucible 38 go through the hole 41 and reach to the PEN film 26. The diameter of the nickel beams is selected slightly larger than the width of the PEN film 26. The diameter of the nickel beams is decided based on the distance between the crucible 38 and the hole 41, and the size of the hole 41.

By using the vacuum evaporator, a nickel thin film 12 is formed on the surface of the PEN film 26 by the following processes. First, the inside of the vacuum chamber 21 is evacuated to the base pressure of ~$10^{-8}$ Torr by the rotary pump 22 and the turbo-molecular pump 23. Then, by flowing current in a circuit composed of the terminals for current injections 33 and 34, pads 35 and 36, and the tungsten filament 37 with the power source 39 and heating the spiral part of the tungsten filament 37, the crucible 38 is heated to a temperature to make nickel evaporate, for example, 1694° C. For example, voltage of 5.5 V and current of 51 A are applied by the power source 39. The evaporation power at this time is 281 W, and the forming speed of the nickel thin film 12 is 0.93 nm per minute. During the evaporation, the pressure of the inside of the vacuum chamber 21 is $10^{-5}$ Torr. The nickel evaporated from the crucible 38 becomes thin beams through the hole 41 of the heat-block plate 40, and the nickel beams reach to the PEN film 26. During the evaporation, the PEN film 26 is moved in the direction of an arrow in FIG. 2, by rotating the take-up roll 28 at the predetermined rotation speed by the rotation mechanism 30. The PEN film 26 is heated with radiant heat from the crucible 38 or the tungsten filament 37. However, in addition to providing the heat-block plate 40, by selecting the distance between the crucible 38 and the PEN film 26 large enough, temperature of the PEN film 26 can be kept to sufficiently lower temperature than the glass-transition temperature $T_g$=120° C., for example, 62° C. The distance between the crucible 38 and the PEN film 26 is 18 cm, for example.

Samples formed the nickel thin film 12 on the PEN film 26 as explained above are made in various thicknesses of the nickel thin film 12, and the surface roughness $R_a$ of the nickel thin film 12 of each sample is measured. The thickness of the nickel thin film 12 is measured by a mechanical method using the stylus surface profiler (trade name: DEKTAK) and an optical method using the diode pumped solid state (DPSS) laser and a photodiode detector. The surface morphologies of the nickel thin film 12 are analyzed by the atomic force microscope (AFM) Nanoscope IIIa. The analysis of the surface roughness $R_a$ based on the AFM image is performed by the structure analysis program (Gwyddion).

Figure 3A:
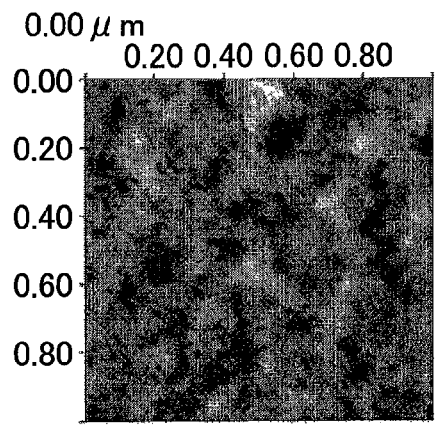
FIGS. 3A, 3B, 3C and 3D are schematic views showing the measurement results of surface roughness of a PEN film and a nickel thin film formed on the PEN film.
Figure 3B:
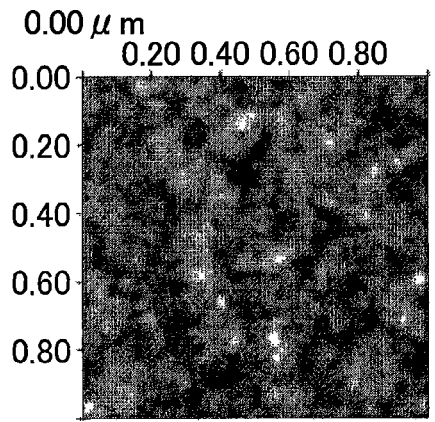
Figure 3C:
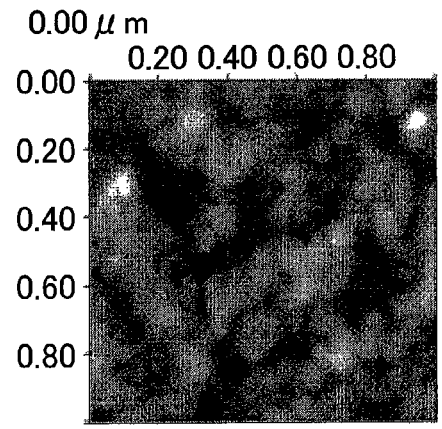
Figure 3D:
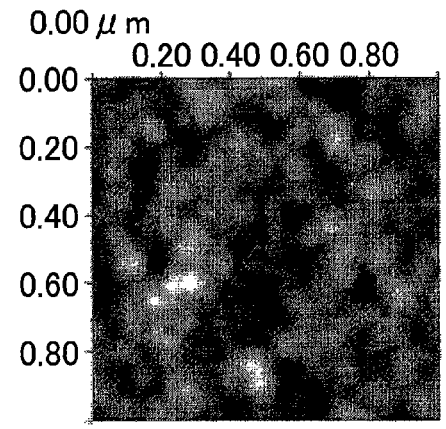

FIGS. 3A, 3B, 3C and 3D show the results of observation by AFM of surface morphologies of the PEN film 26, a 6.3-nm-thick nickel thin film 12 formed on the PEN film 26, a 29-nm-thick nickel thin film 12 formed on the PEN film 26, and a 41-nm-thick nickel thin film 12 formed on the PEN film 26, respectively. Size of each scanning area is 1×1 μm². As shown in FIGS. 3B, 3C and 3D, the nickel thin film 12 is characterized by the surface roughness and round crystal grains in most cases, and shows a cluster structure. The surface roughness $R_a$ of the PEN film 26 is 1.3 nm, the surface roughness $R_a$ of the nickel thin film 12 is 1.1 nm, 0.83 nm and 0.69 nm, in cases the thickness d of the nickel thin film 12 is 6.3 nm, 29 nm and 41 nm, respectively. The surface roughness $R_a$ is defined by the following equation.

$$R_a = \frac{1}{L_x L_y} \int_0^{L_x} \int_0^{L_y} |h(x, y)| dx dy$$

h (x, y) is the height profile as a function of x and y, and $L_x$ is the length of x direction of scanning areas, $L_y$ is the length of y direction of scanning areas. The surface roughness $R_a$ of the nickel thin film 12 decreases to 0.69 nm from 1.3 nm, which is the surface roughness $R_a$ of the PEN film 26, as the thickness d of the nickel thin film 12 increases to 41 nm. It also shows that the grain size increases with the increase of the thickness d of the nickel thin film 12. The average grain size of the nickel thin film 12 is 31.1 nm, 65.8 nm, and 79.0 nm thickness d of 6.3 nm, 29 nm, and 41 nm, respectively. That the average grain size $l_g$ is larger than d indicates that the nickel thin film 12 on the PEN film 26 is suitable for a ballistic magnetoresistance effect element, which will be explained later. Because extra quantum effects arising from surface structures, such as the surface-enhanced effect caused by the electromagnetic field, can be eliminated in case of the application for a magnetic sensor element.

Figure 4:
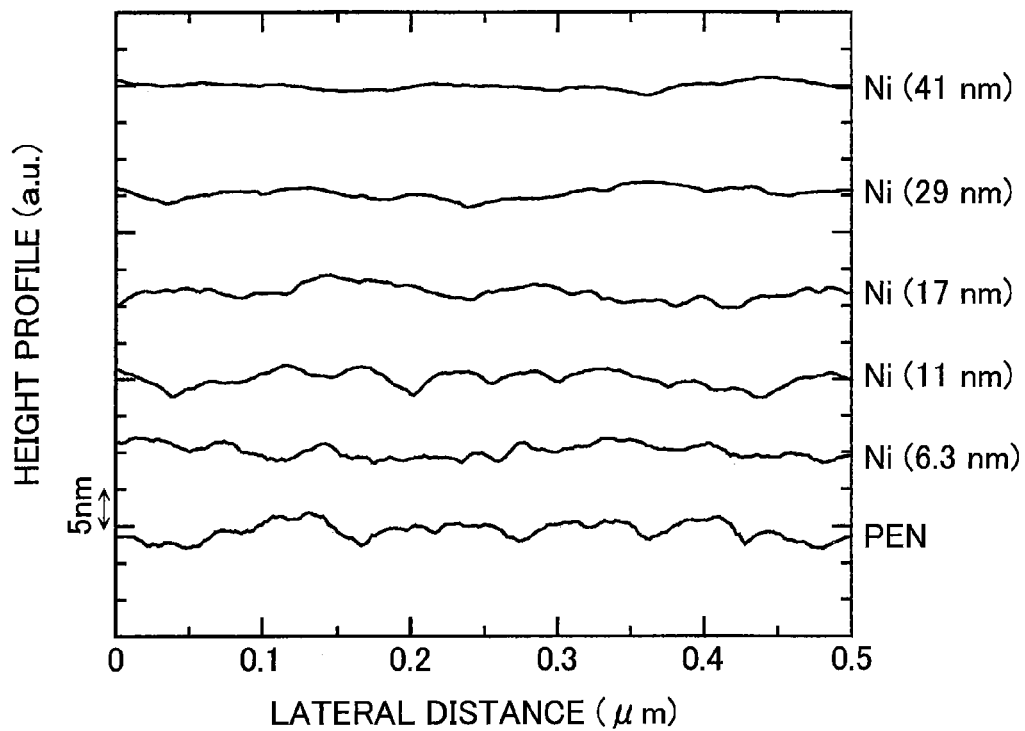
FIG. 4 is a schematic view showing a height profile obtained from the surface condition of a PEN film and a nickel thin film formed on the PEN film.

FIG. 4 shows a typical one-dimensional height profiles obtained from the two-dimensional surface AFM image of the nickel thin film 12 on the PEN film 26. At an earlier stage of the thickness d of the nickel thin film 12 with 11 nm or less, the surface roughness $R_a$ of the nickel thin film 12 slightly decreases compared with the surface roughness $R_a$ of the PEN film 26. In case the thickness d of the nickel thin film 12 exceeds 11 nm, the surface roughness $R_a$ of the nickel thin film 12 rapidly decreases, and in case d=41 nm, the surface of the nickel thin film 12 becomes very flat. When the surface roughness $R_a$ of the nickel thin film 12 rapidly decreases, the grain size rapidly increases.

Figure 5:
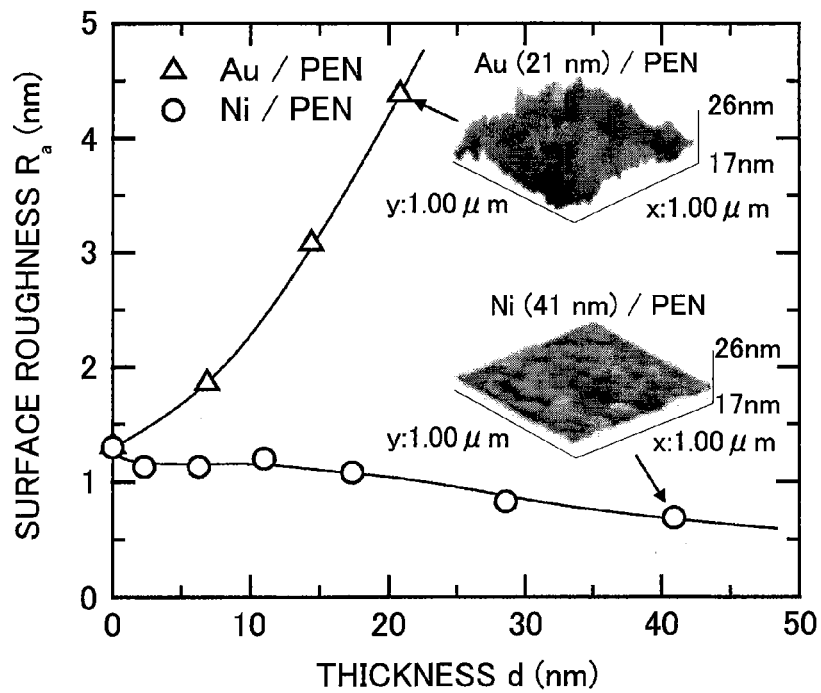
FIG. 5 is a schematic view showing thickness dependence of surface roughness of a PEN film, a nickel thin film and a gold thin film formed on the PEN film.

FIG. 5 shows the thickness dependence of the surface roughness $R_a$ obtained from AFM of the nickel thin film 12 on the PEN film 26 and the gold thin film on the PEN film 26. The insets of FIG. 5 show the AFM images of surface morphologies for the 41-nm-thick nickel thin film 12 on the PEN film 26 and the 21-nm-thick gold thin film on the PEN film 26. As shown in FIG. 5, the surface roughness $R_a$ of the gold thin film on the PEN film 26 rapidly increases from 1.9 nm to 4.8 nm with the increase of the thickness from 6.9 nm to 21 nm. On the contrary, the surface roughness $R_a$ of the nickel thin film 12 on the PEN film 26 decreases with increase of the thickness. In case of forming a 2-nm-thick nickel thin film 12 on the PEN film 26, the surface roughness $R_a$ decreases from 1.3 nm, which is the surface roughness $R_a$ of the PEN film 26, to 1.1 nm. In case the thickness of the nickel thin film 12 is 2 to 11 nm, the surface roughness $R_a$ of the nickel thin film 12 is almost constant value of 1.1 nm, and in case the thickness of the nickel thin film 12 is 11 to 41 nm, the surface roughness $R_a$ of the nickel thin film 12 rapidly decreases from 1.1 nm to 0.69 nm.

Figure 6:
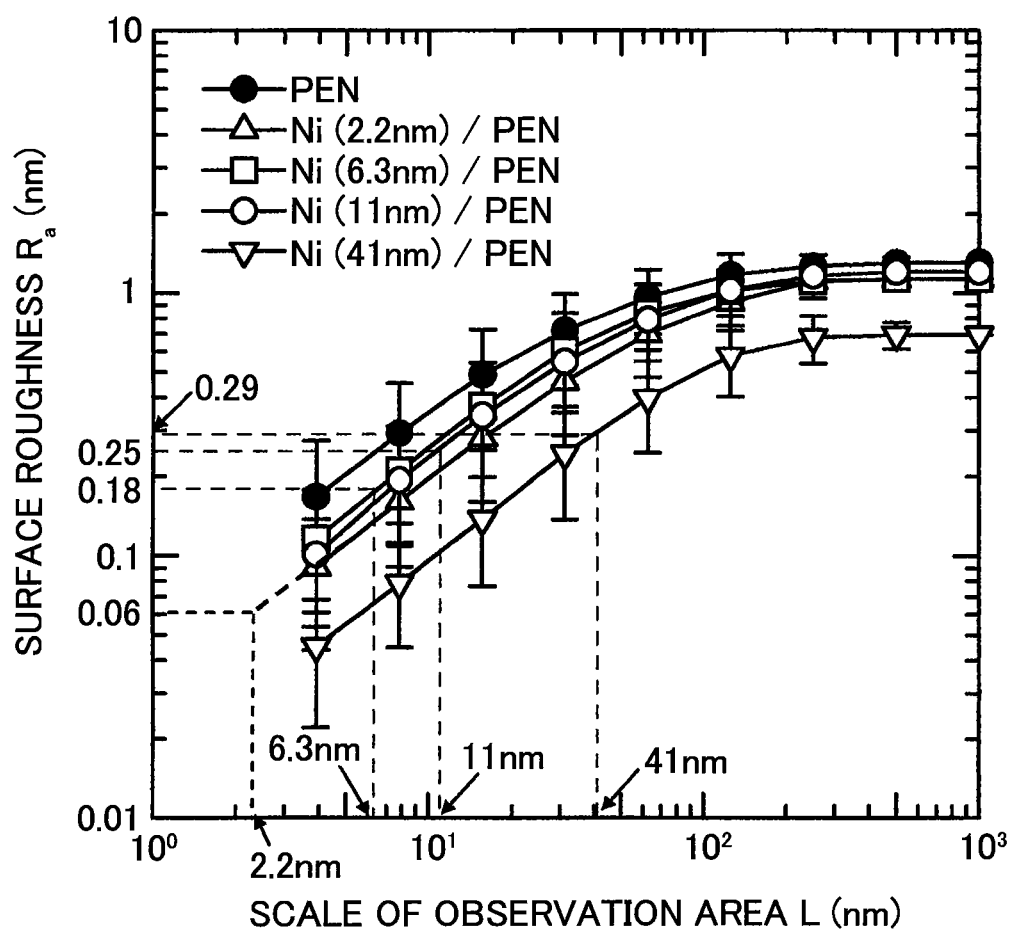
FIG. 6 is a schematic view showing the relation between the surface roughness of a PEN film and nickel thin films formed on the PEN film and the scale of observation area.

FIG. 6 shows observation area size L dependence of the surface roughness $R_a$ of the nickel thin film 12 on the PEN film 26 and the PEN film 26. As shown in FIG. 6, in case the thickness of the nickel thin film 12 is 41 nm, the surface roughness $R_a$ is 0.29 nm or less when L is 41 nm or less. In case the thickness of the nickel thin film 12 is 11 nm, the surface roughness $R_a$ is 0.25 nm or less when L is 11 nm or less. Also, in case the thickness of the nickel thin film 12 is 6.3 nm, the surface roughness $R_a$ is 0.18 nm or less when L is 6.3 nm or less, which corresponds to the thickness of one Ni atomic layer. In case the thickness of the nickel thin film 12 is 2.2 nm, the surface roughness $R_a$ is considered as 0.06 nm or less when L is 2.2 nm or less.

Figure 7:
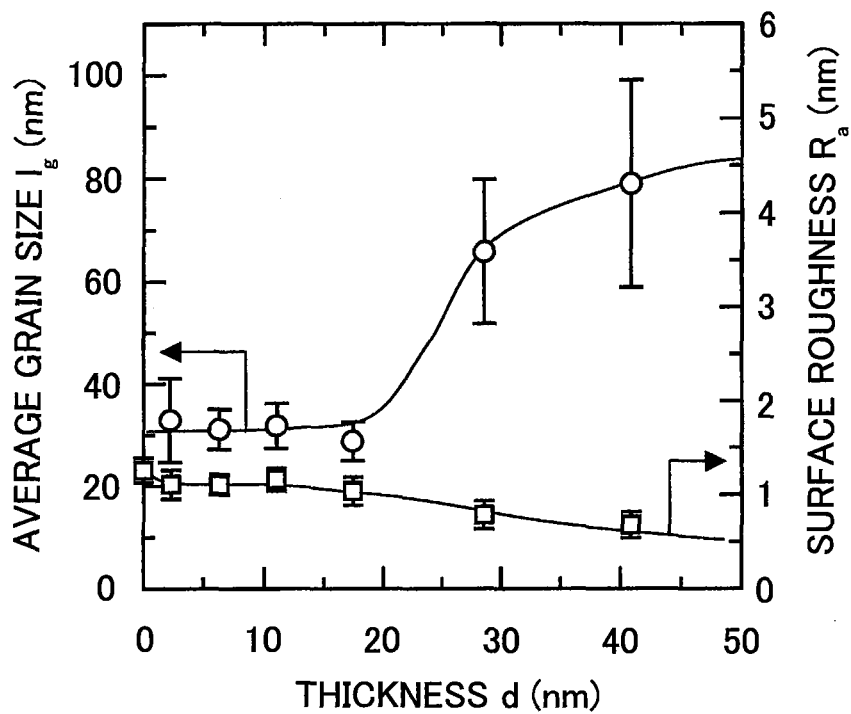
FIG. 7 is a schematic view showing thickness dependence of the average grain size and the surface roughness of a nickel thin film formed on a PEN film.

FIG. 7 shows the thickness dependence of the average grain size $l_g$, obtained from AFM observation of the nickel thin film 12 measured the surface roughness $R_a$ as shown in FIG. 5, together with the thickness dependence of the surface roughness $R_a$. As shown in FIG. 7, the average grain size $l_g$ is almost constant value of 31 nm in the thickness d ranging from 0 to 20 nm, but in case d exceeds 20 nm, the average grain size $l_g$ rapidly increases, and in case d is about 29 nm or more, the average grain size increases to 65 nm or more, which proves the average grain size $l_g$ increases more than twice compared with the thickness d ranging from 0 to 20 nm. The thickness dependence of the surface roughness $R_a$ well corresponds to the thickness dependence of average grain size $l_g$, and with the increase of the average grain size $l_g$, the surface roughness $R_a$ inclines to reduce. This is considered that the grains of the nickel thin film 12 start to become large in size, when the thickness d exceeds about 20 nm.

The thickness dependence of the average grain size $l_g$ and the surface roughness $R_a$ as explained above can be used to control $l_g$ and $R_a$. That is, for example, selecting the thickness d of the nickel thin film 12 from 0 to 20 nm, the nickel thin film 12 with $l_g$ about 31 nm and $R_a$ about 1.1 nm can be obtained, selecting the thickness d about 29 nm or more, the nickel thin film 12 with $l_g$ about 65 nm or more and about 0.8 nm or less can be obtained, and selecting the thickness d of the nickel thin film 12 from 20 to 29 nm, the nickel thin film 12 with the intermediate values of $l_g$ and $R_a$ between the above $l_g$ and $R_a$ can be obtained.

As explained above, according to the first embodiment, by forming a nickel thin film 12 on a polyethylene naphthalate substrate 11 by a vacuum evaporation method, etc., the nickel thin film 12 with an atomic scale flat surface can be formed very easily on the polyethylene naphthalate substrate 11, which is a substrate made of organic material.

Next, a magnetoresistance effect element according to the second embodiment of the present invention is explained. The magnetoresistance effect element is made using the ferromagnetic nano-junction of nickel thin films.

Figure 8:
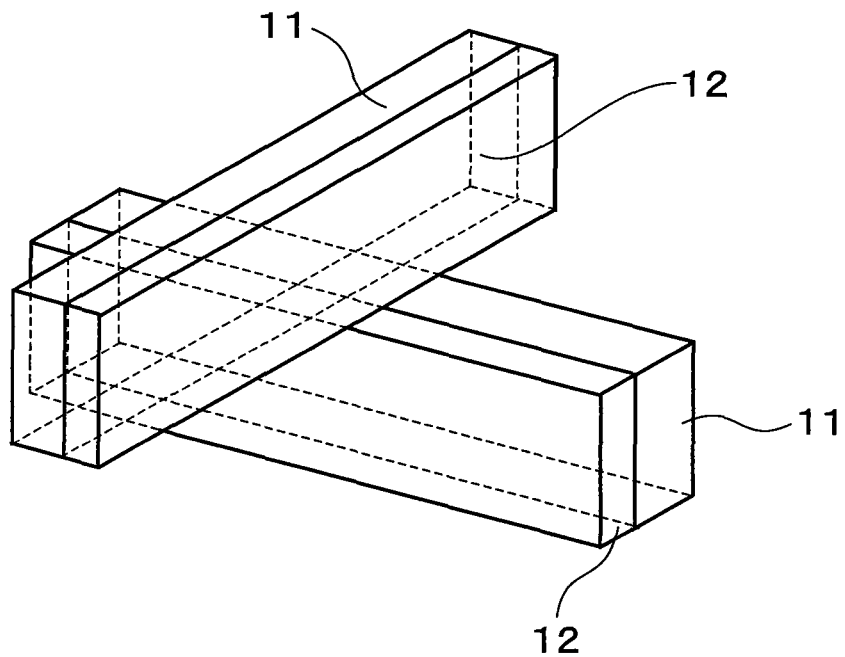
FIG. 8 is a schematic view showing a magnetoresistance effect element according to the second embodiment of the present invention.
Figure 9:
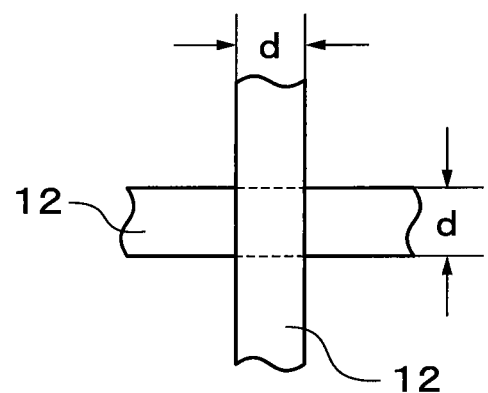
FIG. 9 is a schematic view showing a ferromagnetic nano-junction of the magnetoresistance effect element according to the second embodiment of the present invention.

FIG. 8 shows the magnetoresistance effect element. As shown in FIG. 8, the magnetoresistance effect element is made by using two laminates each comprising the nickel thin film 12 formed on the polyethylene naphthalate substrate 11 by the same method of the first embodiment, and joining these two laminates so that the nickel thin films 12 cross to each other in such a manner that edges of these nickel thin films 12 face each other. The thickness of the nickel thin film 12 is nanometer order, preferably from one atomic layer to 10 nm. The crossing angle is 90°, for example. FIG. 9 shows the ferromagnetic nano-junction formed by joining the edges of the nickel thin films 12 each other at the cross point. In FIG. 9, the polyethylene naphthalate substrate 11 is not illustrated. In FIG. 9, the square part at the cross point of the nickel thin films 12 of the two laminates in the ferromagnetic nano-junction. The area of the ferromagnetic nano-junction is $10\times10=100$ nm$^2$ when the thickness of the nickel thin film 12 is 10 nm, $5\times5=25$ nm$^2$ when the thickness of the nickel thin film 12 is 5 nm, and $1\times1=1$ nm$^2$ when the thickness of the nickel thin film 12 is 1 nm.

An example is explained.

Figure 10A:
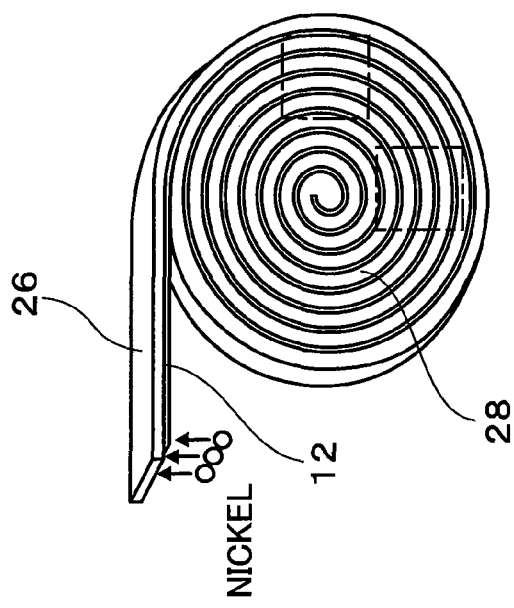
FIGS. 10A, 10B and 10C are schematic views showing an example of a practical method for producing the magnetoresistance effect element according to the second embodiment of the present invention.
Figure 10B:
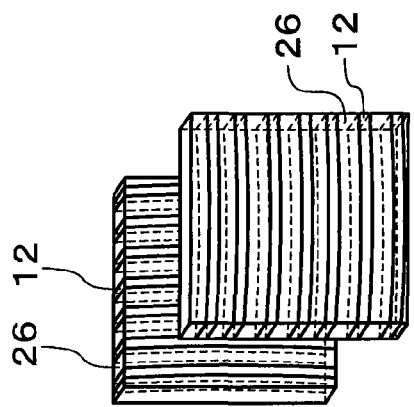
Figure 10C:
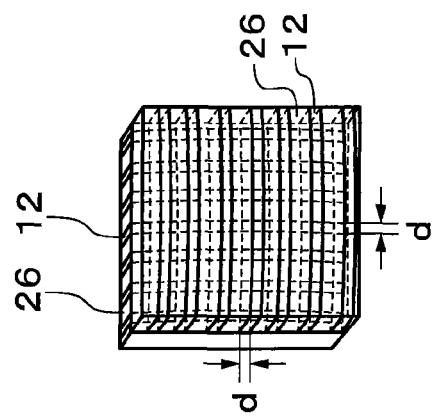

As shown in FIG. 10A, using the vacuum evaporator shown in FIG. 2, a nickel thin film 12 is formed on the PEN film 26, while taking up the nickel thin film 12 by the take-up roll 28. Then, as shown in FIG. 10B, the square-shaped thin piece laminate enclosed by a dot and dashed line in FIG. 10A is cut out from the roll 28 taking up the PEN film 26 formed the nickel thin film 12. Next, as shown in FIG. 10C, the two laminates cut out by the above manner are joined so that the nickel thin films 12 cross to each other in such a manner that edges of these nickel thin films 12 face each other. As a result, many ferromagnetic nano-junctions arranged in a two-dimensional matrix can be obtained and an integrated magnetoresistance effect element can be obtained.

According to the second embodiment, as explained in the first embodiment, it is possible to make the surface of the nickel thin film 12 flat at atomic scale, and by this the size of ferromagnetic nano-junctions can be controlled at atomic level, quantized conductance can be determined precisely, and excellent magnetoresistance effect element showing a giant magnetoresistance effect at room temperature can be realized. Especially, by making the area of the ferromagnetic nano-junctions $5\times5=25$ nm$^2$ or less, an excellent ballistic magnetoresistance effect element showing a giant magnetoresistance effect can be realized. Additionally, the average grain size $l_g$ of the nickel thin film 12 can be made larger than d, and by this the extra quantum effect arising from surface structure such as surface-enhanced effect, caused by electromagnetic field can be eliminated, and an excellent magnetic sensor element using only a giant magnetoresistance effect can be realized.

Figure 11A:
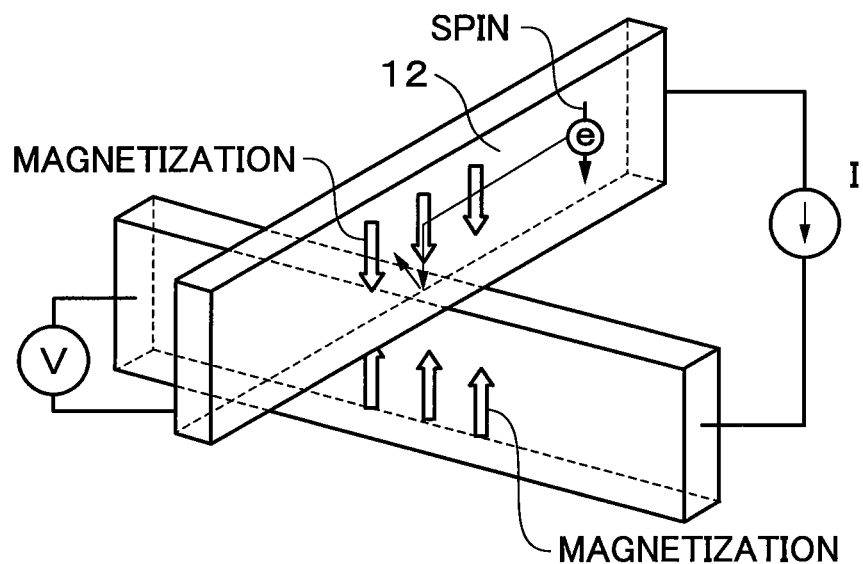
FIGS. 11A and 11B are schematic views showing an example of a usage of the magnetoresistance effect element according to the second embodiment of the present invention to a magnetic head.
Figure 11B:
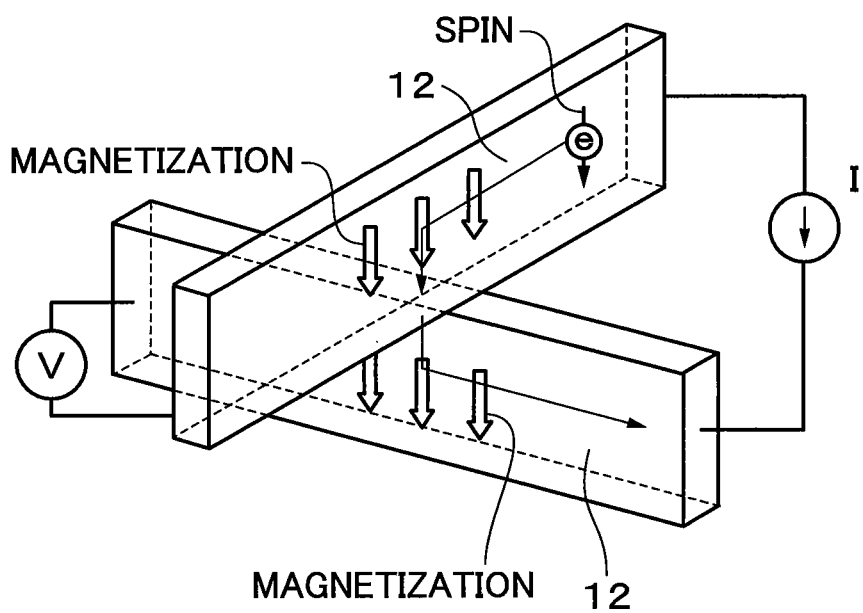

The magnetoresistance effect element is suitable to apply to a magnetic head for magnetic disk device. FIG. 11A shows that the resistance R of the magnetoresistance effect element is large, and FIG. 11B shows that the resistance R of the magnetoresistance effect element is small. In FIGS. 11A and 11B, the polyethylene naphthalate substrate 11 is not illustrated. In case shown in FIG. 11A, by the magnetic field applied to the magnetoresistance effect element, the direction of magnetization of the upper nickel thin film 12 and the direction of magnetization of the lower nickel thin film 12 are opposite each other. Therefore, when constant electric current flows between these nickel thin films 12, electrons (e) are scattered at the junction at the cross point of these nickel thin films 12 and the resistance R is large. As a result, a large voltage V can be obtained. In case shown in FIG. 11B, by the magnetic field applied to the magnetoresistance effect element, the direction of magnetization of the upper nickel thin film 12 and the direction of magnetization of the lower nickel thin film 12 are the same. Therefore, when constant electric current flows between these nickel thin films 12 electrons (e) can go through the junction at the cross point of these nickel thin films 12, and the resistance R is small. As a result, a small voltage V can be obtained. By measuring the voltage V, data written on a magnetic disk can be read.

Next, a method for formation of a thin metallic wire according to the third embodiment of the present invention is explained.

According to the third embodiment, by making oblique evaporation using nickel beams by the vacuum evaporator shown in FIG. 2, a nickel thin film 12 is formed on a polyethylene naphthalate substrate 11 as shown in FIG. 1. In the oblique evaporation, the inclination of nickel beams for the major surface of the polyethylene naphthalate substrate 11 is 1 to 3°, for example.

An example is explained.

As the polyethylene naphthalate substrate 11, a PEN film (trade name: TEONEX Q65) having 5 mm width and 100 μm thick made by Teijin DuPont Japan Ltd. is used after cutting out in the predetermined shape. The nickel thin film 12 is formed on the PEN film by the oblique evaporation using nickel beams with the inclination of 1 to 3° at room temperature.

Figure 12:
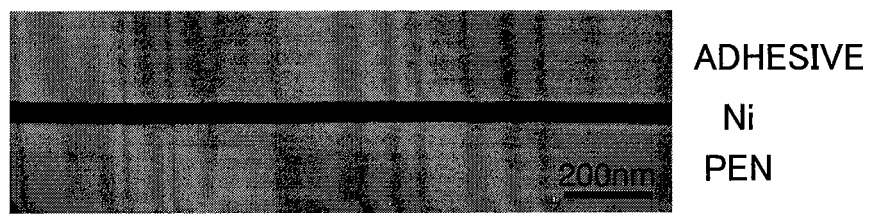
FIG. 12 is a cross-sectional transmission electron microscope photograph of a sample formed a 40-nm-thick nickel thin film on a polyethylene naphthalate substrate formed by a method for formation of a thin metallic wire according to the third embodiment of the present invention.
Figure 13:
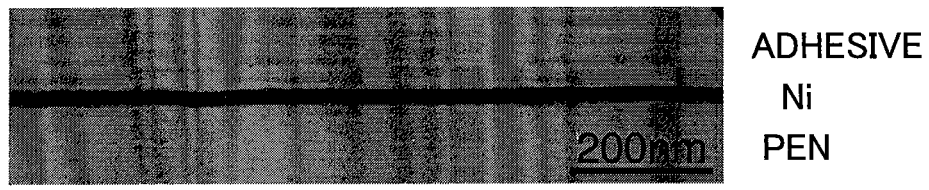
FIG. 13 is a cross-sectional transmission electron microscope photograph of a sample formed a 20-nm-thick nickel thin film on a polyethylene naphthalate substrate formed by a method for formation of a thin metallic wire according to the third embodiment of the present invention.

FIG. 12 shows a cross-sectional transmission electron microscope image (cross-sectional TEM image) of a sample formed a 40-nm-thick nickel thin film 12. FIG. 13 shows a cross-sectional TEM image of a sample formed a 20-nm-thick nickel thin film 12. In FIGS. 12 and 13, the adhesive covering on the surface of the nickel thin film 12 is the adhesive used to glue a support substrate (not illustrated) to the side of the nickel thin film 12 at the time of preparing a sample for a cross-sectional TEM observation. It is understood from FIGS. 12 and 13 that nickel atoms do not penetrate in the PEN film, and a clear nickel/PEN interface is formed and the nickel/PEN interface is very flat.

As explained above, it is understood that in order to obtain a clear, flat nickel/PEN interface, oblique evaporation using nickel beams is effective to form the nickel thin film 12.

Seeing the cross-section of samples shown in FIGS. 12 and 13, it is understood that ultra-fine nickel thin metallic wires with constant line width having a 40-nm-line width and a 20-nm-line width, respectively can be formed. Especially, the 20-nm-line width of the thin metallic wire of the sample shown in FIG. 13 is smaller than the minimum line width 27 nm (see Microelectronic Engineering, 83 (2006) pp. 672-675) made by the conventional microfabrication technique using the optical lithography, which has very large technical meaning.

In order to produce a substrate formed many thin metallic wires, for example, as shown in FIG. 10B, a square-shaped thin piece laminate is cut out from the roll 28 taking up the PEN film 26 formed the nickel thin film 12.

Figure 14:
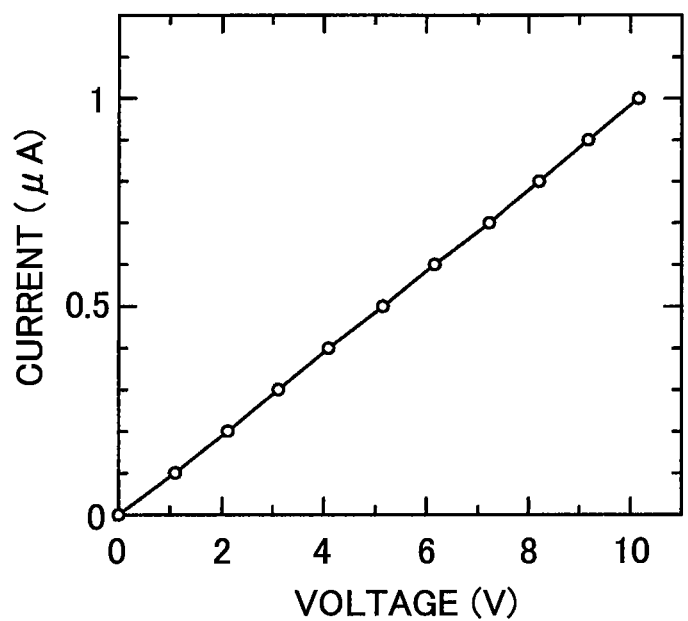
FIG. 14 is a schematic view showing the measurement results of current-voltage characteristic using a sample, which uses two laminates formed a 17-nm-thick nickel thin film on a polyethylene naphthalate substrate by a method for formation of a thin metallic wire according to the third embodiment of the present invention, and the laminates are joined so that the nickel thin films cross to each other in such a manner that edges of the nickel thin films face each other.

Similar to the samples shown in FIGS. 8 and 9, a sample is made by using two laminates forming a 17-nm-thick nickel thin film 12 on the polyethylene naphthalate substrate 11 and joining these two laminates so that the nickel thin films 12 cross to each other in such a manner that edges of these nickel thin films 12 face each other. And, a voltage is applied between the nickel thin film 12 of one laminate and the nickel thin film 12 of the other laminate, and the flowing current is measured. FIG. 14 shows the results. It is understood from FIG. 14 that excellent ohmic characteristic without time-dependent change is obtained and edges of the nickel thin films 12 are ohmic-contacted excellently.

As explained above, according to the third embodiment, a thin metallic wire made of ultra-fine nickel with a nanometer-order line width is easily formed.

Next, a measurement element of one molecule according to the fourth embodiment of the present invention is explained.

Figure 15:
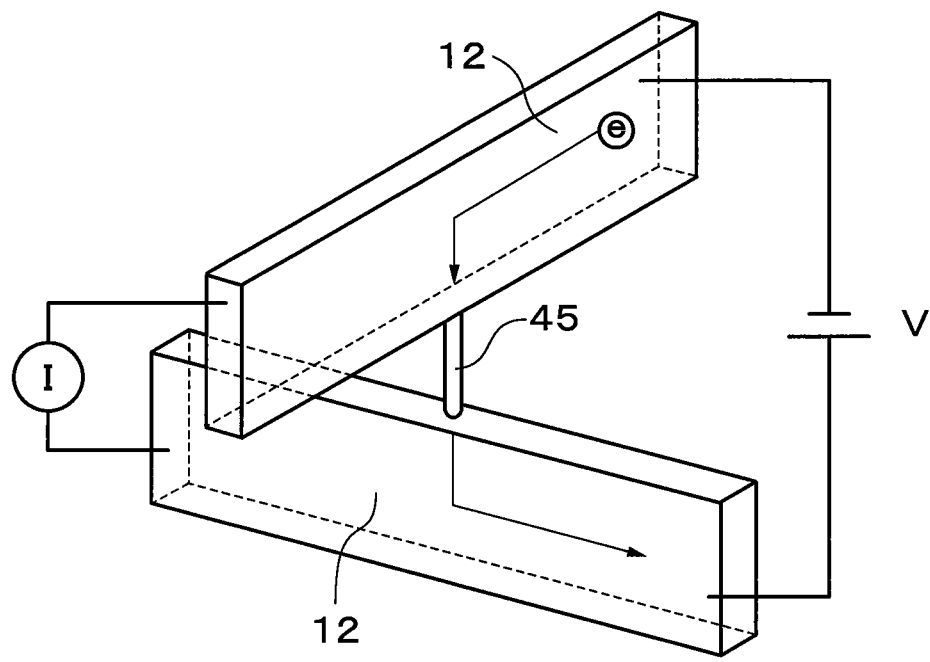
FIG. 15 is a schematic view showing a measurement element of one molecule according to the fourth embodiment of the present invention.

As shown in FIG. 15, the measurement element of one molecule uses two laminates formed the nickel thin film 12 on the polyethylene naphthalate substrate 11. These two laminates are arranged so that the nickel thin films 12 cross to each other in such a manner that edges of these nickel thin films 12 face each other, sandwiching a molecule 45 to be measured between the nickel thin films 12. Then, a voltage V is applied between the nickel thin film 12 of one laminate and the nickel thin film 12 of the other laminate, and a current I flows between these nickel thin films 12 through the molecule 45. By measuring the current response characteristic, the measurement of one molecule can be performed. The thickness of the nickel thin film 12 is appropriately decided according to the size of the molecule 45, for example, about 1 nm. The molecule 45 is not specially limited, and may be pentacene or DNA and the like.

As methods of the measurement of one molecule, the break junction method sandwiching a molecule between a pair of tiny convex, shaped gold electrodes (see Science, 278, 252 (1997)) and the nanopore method sandwiching a molecule between a tiny convex shaped gold electrode and a flat gold electrode (see Science, 286, 1550 (1999)) are known. However, the size of tips of these gold electrodes is large, about 30 nm to 50 nm, so it is difficult to perform the measurement of one molecule by these methods. Also, a nanoimprint lithography method is known that one molecule layer and a metal film are sequentially formed to cover the metal wiring of the first layer on the whole surface, and by patterning these one molecule layer and metal film, the metal wiring of the second layer is formed, crossing with the metal wiring of the first layer, and a structure that one molecule layer is sandwiched between the metal wirings at the cross point is formed (see Appl. Phys. A81 1331 (2005)). However, the width of these metal wirings is large enough, 40 nm, so it is also difficult to perform the measurement of one molecule by the method. In contrast to this, according to the fourth embodiment, the thickness of the nickel thin film 12 can be made almost the same size of the molecule 45. Therefore, only one molecule 45 can be sandwiched between edges of the nickel thin films 12. And, the measurement of one molecule can be performed very easily.

In case of performing the measurement of one molecule for plural molecules 45, the following method is applied. As shown in FIG. 10B, a square-shaped thin piece laminate is cut out from the roll 28 taking up the PEN film 26 formed the nickel thin film 12. Then, as shown in FIG. 10C, the two laminates cutting out as above are arranged so that the nickel thin films 12 cross to each other, and at each cross point, edges of the nickel thin films 12 are attached facing each other, sandwiching the molecule 45 to be measured between the two edges of the nickel thin films 12. By the method, the measurement of one molecule for plural molecules 45 can be performed. Therefore, the measurement efficiency can be improved greatly.

Next, a nonvolatile memory according to the fifth embodiment of the present invention is explained.

In the nonvolatile memory, two laminates each comprising the nickel thin film 12 formed on the polyethylene naphthalate substrate 11 are used, and these two laminates are arranged so that the nickel thin films 12 cross to each other in such a manner that edges of the nickel thin films 12 face each other, sandwiching a molecule 45 between the nickel thin films 12. In this case, the molecule 45 comprises a memory cell. A molecule capable of changing its state by a voltage and having hysteresis characteristic which keeps its state is used as the molecule 45. To write data in the nonvolatile memory, as shown in FIG. 15, a voltage V corresponding to the data to be written is applied between the nickel thin film 12 of one laminate and the nickel thin film 12 of the other laminate, and data are written in the molecule 45. Reading data of the nonvolatile memory can be made by measuring current I flowing the nickel thin films 12 when the predetermined voltage V is applied between the nickel thin film 12 of one laminate and the nickel thin film 12 of the other laminate.

Figure 16:
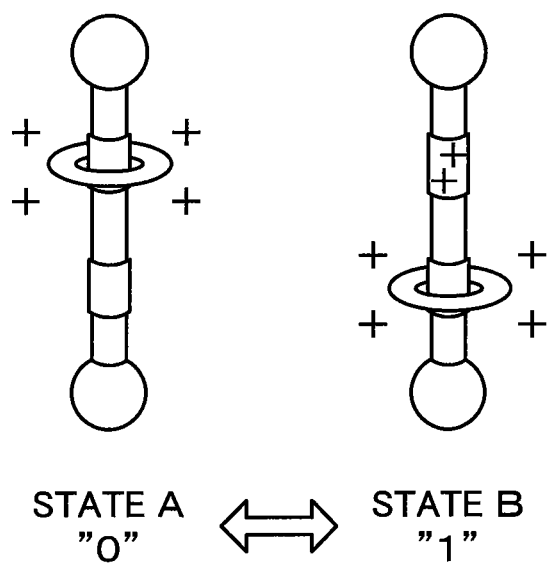
FIG. 16 is a schematic view showing a molecular structure of rotaxane, as an example of a molecule to be sandwiched between the edges of the nickel thin films in a nonvolatile memory according to the fifth embodiment of the present invention.

FIG. 16 shows schematically rotaxane, as an example of the molecule 45. In FIG. 16, a plus (+) means a positive charge. As shown in FIG. 16, by the applying voltage, a position of a ring composed of cyclobis (paraquat-p-phenylene) changes, moving upward (state A), and moving downward (state B). By the changes, data 0 or 1 can be written, for example.

Typically, by arranging the structure shown in FIG. 15 in a two-dimensional matrix, a memory cell array is constructed. The process for this is as follows. As shown in FIG. 10B, after cutting out square-shaped thin piece laminate from the roll 28 taking up the PEN film 26 formed the nickel thin film 12, the two cut out laminates are joined so that, the nickel thin films 12 cross to each other in such a manner that edges of the nickel thin films 12 face each other, sandwiching the molecule 45 between the two edges. By this, the nonvolatile memory arranged a memory cell array in a two-dimensional matrix can be realized.

According to the fifth embodiment, the nonvolatile memory based on a new principle can be realized.

Next, a transparent electrode according to the sixth embodiment of the present invention is explained.

According to the sixth embodiment, as shown in FIG. 10B, a square-shaped thin piece laminate cut out from the roll 28 taking up the PEN film 26 formed the nickel thin film 12 is used as a transparent electrode. That is, the laminate is formed with the PEN film 26 and the nickel thin film 12 alternately, in other words, many ultra-fine thin metallic wires composed of the nickel thin films 12 are buried inside of the PEN substrate. The transparency of the PEN film 26 is very high. Moreover, by making the thickness of the nickel thin film 12 a nanometer order. Therefore, the whole laminate can be transparentized. Thus the laminate can be used as a transparent electrode.

Figure 17:
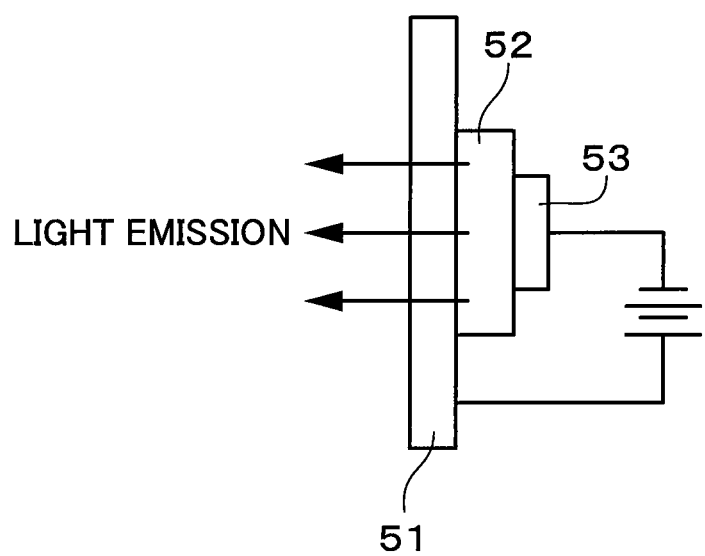
FIG. 17 is a schematic view showing an example of application of a transparent electrode according to the sixth embodiment of the present invention.

The transparent electrode is applicable to various applications. An example is shown in FIG. 17. As shown in FIG. 17, by the example, a transparent electrode 51 composed of the aforementioned laminate is attached to the light-emitting face of a light emitting device 52, and a thin metallic wire composed of the nickel thin film 12 buried the light emitting device 52. The other terminal of the light emitting device 52 is provided with an electrode 53 composed of metal or the like. And, by applying the predetermined voltage between the thin metallic wire buried inside of the transparent electrode 51 connected to a terminal of the light emitting device 52 and the electrode 53, light emission of the light emitting device 52 can be obtained.

As the light emitting device 52, for example, a light emitting diode (LED), an organic electroluminescence (EL) device, and the like are listed, but not limited to them.

According to the sixth embodiment, as a laminate burying a thin metallic wire composed of the nickel thin film 12 inside of the PEN substrate is used as a transparent electrode, an extremely lightweight, and flexible transparent electrode can be obtained. Moreover, a transparent electrode can be obtained at a low price as it is not necessary to use a transparent electrical conducting material like an expensive ITO.

The transparent electrode is suitable to apply to various kinds of displays, displays of various electronic devices (a mobile phone, a portable audio terminal device, an in-car navigator, a digital camera, a laptop computer, etc.), and a photovoltaic cell.

The embodiments and examples of the present invention are precisely explained. However, the present invention is not limited to the aforementioned embodiments and examples, and a variety of variation based on the technical idea of the present invention is possible.

Also, in case of forming a metal or alloy (for examples, iron, nickel-iron-alloy, and iron-nickel-chromium alloy, etc.) thin film other than a nickel thin film on a polyethylene naphthalate substrate, the same effect as forming a nickel thin film can be obtained. Also, in case of forming a nickel thin film or other metal or alloy thin film on a substrate made of organic materials other than polyethylene naphthalate, especially polyester other than polyethylene naphthalate (for examples, polyethylene terephthalate, polytrimethylene terephthalate, polybutylene terephthalate, and polybutylene naphthalate, etc.) and polyimide, etc., the same effect as forming a nickel thin film on a polyethylene naphthalate substrate can be obtained, according to the surface roughness of the substrate.

The invention claimed is:

1. A ferromagnetic nano junction element characterized by using two laminates each comprising a nickel thin film having a thickness of 2 nm to 20 nm formed by a vacuum evaporation method on a top surface of a polyethylene naphthalate substrate having the surface roughness equal to or less than 1.6 nm, the nickel thin film having the surface roughness less than 1.6 nm and less than the surface roughness of the polyethylene naphthalate substrate, each of the two laminates having a top portion, a bottom portion, and a side portion positioned between the top portion and the bottom portion, wherein the top portion comprises the nickel thin film, the bottom portion comprises a bottom surface of the polyethylene naphthalate substrate, and the side portion comprises a side edge of the nickel thin film and a side edge of the polyethylene naphthalate substrate and attaching the two laminates to each other to join them so that the nickel thin films cross to each other in such a manner that the side edges of the nickel thin films face each other.

2. The ferromagnetic nano junction element according to claim 1 wherein a molecule that is separate from the nickel thin film is sandwiched between the side edges of the nickel thin films.

3. A method for producing a ferromagnetic nano-junction element characterized by using two laminates each comprising a nickel thin film having a thickness of 2 nm to 20 nm formed by a vacuum evaporation method on a top surface of a polyethylene naphthalate substrate having surface roughness equal to or less than 1.6 nm and less than the surface roughness of the polyethylene naphthalate substrate, the nickel thin film having the surface roughness less than 1.6 nm, each of the two laminates having a top portion, a bottom portion, and a side portion positioned between the top portion and the bottom portion, wherein the top portion comprises the nickel thin film, the bottom portion comprises a bottom surface of the polyethylene naphthalate substrate, and the side portion comprises a side edge of the nickel thin film and a side edge of the polyethylene naphthalate substrate and attaching the two laminates to each other to join them so that the nickel thin films cross to each other in such a manner that side edges of the nickel thin films face each other.

4. The method for producing a ferromagnetic nano junction element according to claim 3 wherein a molecule that is separate from the nickel thin film is sandwiched between the side edges of the nickel thin films.

* * * * *

UNITED STATES PATENT AND TRADEMARK OFFICE
CERTIFICATE OF CORRECTION

PATENT NO. : 8,795,856 B2
APPLICATION NO. : 12/679293
DATED : August 5, 2014
INVENTOR(S) : Hideo Kaiju et al.

It is certified that error appears in the above-identified patent and that said Letters Patent is hereby corrected as shown below:

On the title page, item (73), change "National University Corporation, Sapporo-Shi, Hokkaido (JP); Hokkaido University, Sapporo-Shi, Hokkaido (JP)" to --National University Corporation Hokkaido University, Sapporo-Shi, Hokkaido (JP)--.

In the Claims

Column 12, line 53, change "nano junction" to --nano-junction--.

Column 13, line 4, change "nano junction" to --nano-junction--.

Column 13, line 26, change "nano junction" to --nano-junction--.

Signed and Sealed this
Eleventh Day of November, 2014

Michelle K. Lee
*Deputy Director of the United States Patent and Trademark Office*